US008602049B2

United States Patent
Lose et al.

(10) Patent No.: US 8,602,049 B2
(45) Date of Patent: Dec. 10, 2013

(54) METHODS AND APPARATUS FOR FILLING SUPERCONDUCTIVE MAGNETS

(75) Inventors: Niels Lose, Starnberg (DE); Rudolf Kawasch, Roth (DE); Nicholas Stanier, Thame (GB)

(73) Assignee: Linde Aktiengesellschaft, Munich (DE)

( * ) Notice: Subject to any disclaimer, the term of this patent is extended or adjusted under 35 U.S.C. 154(b) by 737 days.

(21) Appl. No.: 12/816,666

(22) Filed: Jun. 16, 2010

(65) Prior Publication Data
US 2011/0312502 A1 Dec. 22, 2011

(51) Int. Cl.
*B67D 7/72* (2010.01)
(52) U.S. Cl.
USPC .............. 137/209; 141/197; 141/215; 222/61
(58) Field of Classification Search
USPC .......... 137/209, 206, 487.5, 565.13; 141/197, 141/215, 52, 61; 222/61, 396
See application file for complete search history.

(56) References Cited

U.S. PATENT DOCUMENTS 5,960,636 A * 10/1999 Schuck et al. ..................... 62/63
2011/0179811 A1* 7/2011 Bohn et al. ........................ 62/62

OTHER PUBLICATIONS

Raaman N., "Phytochemical Techniques Passage", 2006, pp. 167-168, New India Publishing Agency, New Delhi, India.
Anonymous, "How to Fill with Liquid Helium", Dec. 12, 2005, p. 1, retrieved from the Internet.
Anonymous, "Superconducting Rock Magnetometer Cryogenic System Manual", 2G Enterprises publication, Mar. 1, 2002, pp. 1-38.
Straty, G.C. and Adams, D., "Highly Sensitive Capacitive Pressure Gauge", Review of Scientific Instruments, Jan. 1, 1969, Nov. 1969, p. 1393.

* cited by examiner

*Primary Examiner* — Craig Schneider
(74) *Attorney, Agent, or Firm* — Philip H. Von Neida

(57) ABSTRACT

A method and apparatus for filling superconductive magnets is disclosed by using gaseous helium to control the flow of liquefied helium from a container to a magnet. By measuring the pressure of the gaseous helium in the container of liquefied helium, it can be determined when to stop the flow of liquefied helium. This can reduce quenches and helium losses which can occur during the transfer of liquid helium from the dewar to the superconductive magnet.

27 Claims, 3 Drawing Sheets

METHODS AND APPARATUS FOR FILLING SUPERCONDUCTIVE MAGNETS

BACKGROUND OF THE INVENTION

Methods for filling superconductive magnets are disclosed. An apparatus and method for reducing quenches when filling a superconductive magnet with liquid helium from a cryostat (dewar). The method will reduce helium losses which can occur during the transfer of liquid helium from the dewar to the superconductive magnet.

Magnetic resonance imaging (MRI) and nuclear magnetic resonance (NMR) systems employing superconductive or other types of magnets are employed in fields such as medical diagnostics. The superconductive magnets comprise a coil assembly having a main coil which is at least partially immersed in liquid helium contained in a helium reservoir. The reservoir is typically surrounded by dual thermal shields which in turn are surrounded by a vacuum enclosure. Nb—Ti superconductive coils typically operate at a temperature of approximately 4 Kelvin, and Nb—Sn superconductive coils typically operate at a temperature of approximately 10 Kelvin. When the coil assembly is cooled to such a temperature it becomes superconductive and the magnet field strength is maintained without significant further energy input.

A necessity for the operation of a superconductive magnet is the presence of a coolant. This coolant can be liquid helium which can achieve the low temperatures necessary to allow the material of the magnet coil to reach a superconductive state. This need for low temperatures necessitates that the reservoir in the magnet must be filled with a sufficient amount of liquid helium at a cold enough temperature to allow the magnet coils to become superconducting. The magnet must be filled with the liquid coolant before the superconducting coils can be energized.

The common practice in filling these magnets is to transfer a push gas into a dewar containing liquid helium until a whistling sound is heard from the dewar. This whistling sound indicates that the cold gaseous helium is now entering the dip tube and that no more liquid helium can be withdrawn from the dewar. When the whistling sound is heard, the transfer of the liquid helium is immediately stopped and a new full dewar is connected if the desired level of liquid helium has not been achieved with the now empty dewar.

Dewars are available with built in level meters; however, these dewars can be very expensive and their level meters often inaccurate.

The whistling sound further indicates that either cold gaseous helium or a two phase flow of cold gaseous helium and liquid helium is entering the cryostat of the magnet. This is undesirable because the cold gaseous helium may cause the superconductive magnet to quench. Further, the cold gaseous helium will not collect as a liquid in the cryostat of the superconductive magnet. The gas will be vented to the atmosphere through the vent/relief valve or by-pass valve of the magnet resulting in a complete loss of this helium from the transfer process system.

Another problem that can occur when transferring liquid helium from a dewar into a cryostat of a superconductive magnet, is slow filling. In this case the transfer rate of liquid helium is lower that the normal transfer rate, which typically is 6-9 liters per minute (lpm) transferred out of the dewar.

Slow fill is indicative of an abnormal condition in the transfer system. Such a condition could be loss of vacuum in the transfer lines, insufficient dewar pressure, formation of ice or frozen air in the transfer line or at the magnet inlet or mail function of the superconductive magnets vent/pressure relief valve.

When a slow fill is observed a set of corrective actions must immediately be taken otherwise there is an increased risk of a quench occurring and very often slow fills results in high losses of liquid helium.

Therefore it is desirable to detect a slow fill a soon as possible after the transfer process has begun.

Traditionally a slow fill is detected by observing the increase of the superconductive magnets level meter over a certain time, typically 5 to 10 minutes, however a disadvantage of this method is that the reliability of the observations depends on the accuracy of the superconductive magnets level meter and the total capacity of the cryostat which varies from magnet type to magnet type. This imprecision can lead to errors in diagnosing the slow fill and can result in quench and loss of helium.

SUMMARY OF THE INVENTION

In one embodiment, there is disclosed a method for filling a magnet comprising feeding gaseous helium to a container of liquefied helium; feeding liquefied helium to the magnet; measuring the flow rate of the gaseous helium to the container and measuring the pressure of the gaseous helium in the container; and stopping the flow of the liquefied helium when the measured pressure reaches a peak value and begins to drop.

In another embodiment, there is disclosed a method for stopping a filling process comprising feeding gaseous helium to a dewar containing liquefied helium; feeding the liquefied helium to a magnet; measuring the flow rate of the gaseous helium; measuring the pressure of the gaseous helium in the dewar; and stopping the flow of the liquefied helium when the measured pressure reaches a peak value and begins to drop.

In a different embodiment, there is disclosed a method for detecting a slow transfer of liquid helium from a dewar to a cryostat of a super conductive magnet comprising feeding gaseous helium to a container of liquefied helium; feeding liquefied helium to said magnet; measuring a flow rate of said gaseous helium from said container and measuring the amount of liquefied helium pushed out of said container; and stopping the flow of said gaseous helium when the ratio of the flow rate of the gaseous helium to the amount of liquefied helium pushed out of said container is different than 6 or 7 to 1.

There is further disclosed an apparatus comprising a container of gaseous helium; a container of liquefied helium; fluid connection means connecting the container of gaseous helium with the container of liquefied helium; means for measuring the flow rate of the gaseous helium and means for measuring the pressure of the gaseous helium in the container of liquefied helium.

The cryostat of a superconductive magnet that is present in a device such as a magnetic resonance imaging (MRI) device is filled with liquid helium from a container of liquefied helium which is usually a dewar. Gaseous helium from an external source such as a gas cylinder or a gas pipe line is used to pressurize the dewar. This pressurization is to a pressure which is required to transfer the liquid helium from the dewar into the cryostat.

The gaseous helium is referred to as "push gas" and is introduced into the head space of the dewar by use of a pressure regulator. The pressure regulator will maintain a relatively constant pressure in the dewar. The overpressure provided by the push gas pushes the liquid helium out of the dewar through a dip tube installed inside the dewar. The dip tube has an inlet connection located near the bottom of the dewar and has an outlet connection located outside the dewar.

The dip tube outlet is connected to a liquid helium transfer line which is connected to the inlet turret of the cryostat in the magnet. The common practice is to transfer the push gas into the dewar until a whistling sound is heard from the dewar. This whistling sound indicates that the cold gaseous helium is now entering the dip tube and that no more liquid helium can be withdrawn from the dewar. When the whistling sound is heard, the transfer of the liquid helium is immediately stopped and a new full dewar is connected if the desired level of liquid helium has not been achieved with the now empty dewar.

When the whistling sound is heard, this is indicative that either cold gaseous helium or a two phase flow of cold gaseous helium and liquid helium are entering the cryostat of the magnet. This is undesirable because the cold gaseous helium may cause the superconductive magnet to quench. Further, the cold gaseous helium will not collect as a liquid in the cryostat of the superconductive magnet. The gas will be vented to the atmosphere through the vent/relief valve or by-pass valve of the magnet resulting in a complete loss of this helium from the transfer process system.

The invention determines a point in time where the transfer of liquid helium should be stopped and before the dewar whistles. This point in time is when the measured pressure of the gaseous helium in the container reaches a peak or maximum value and begins to descend in pressure. The fill mechanism is immediately turned off and filling operation stops. This will reduce the possibility of quench of the magnet occurring as well as the loss of gaseous helium from the transfer process system.

The method may be employed in any system where liquid helium is transferred from one cryostat to another by the use of a push gas for pressurizing the donor cryostat. This includes transfer from a dewar to an MRI superconductive magnet; transfer from a dewar to an NMR superconductive magnet; and transfer from a mobile storage tank such as an ISO to an MRI or NMR superconductive magnet.

A slow transfer of liquid helium is also problematic and can be indicative of a problem in the filling equipment or filling process. A slow fill is one defined as when the ratio of the flow rate of the gaseous helium to the amount of liquefied helium pushed out of said container is less than 6 or 7 to 1, a slow fill rate exists and the filling operation must be ceased quickly.

DETAILED DESCRIPTION OF THE INVENTION

Figure 1:
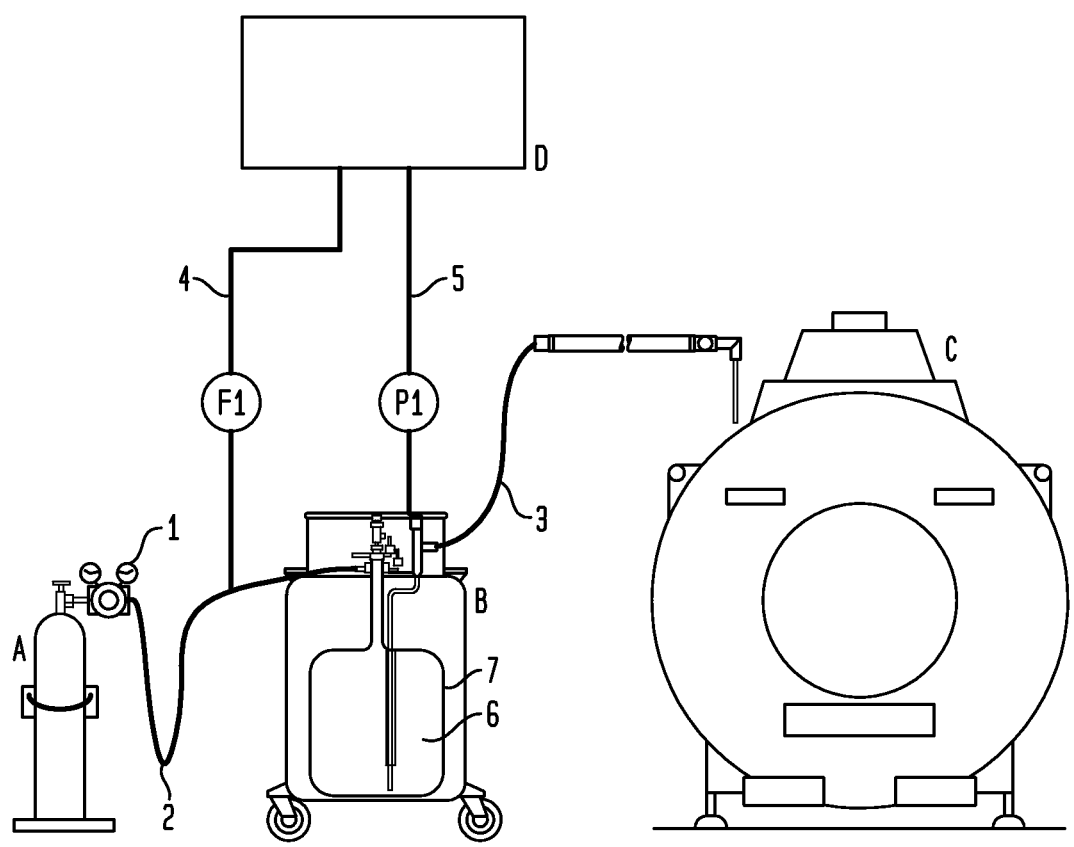
FIG. 1 is a schematic of a helium filling system according to the invention.

Turning to FIG. 1, a schematic of a liquid helium filling process is shown. A helium gas cylinder A is connected to a liquefied helium dewar by connection means 2. The gaseous helium is metered through a two-stage pressure regulator 1 which can be used to adjust the pressure of the gaseous helium.

A transfer monitoring and control unit D is connected to line 2 through a line 4 that is capable of measuring the flow rate F1 of the gaseous helium in line 2 and transmitting this data to the control unit D. Line 2 connects with the input to the dewar containing liquefied helium B wherein the liquefied helium resides in the tank 7 within the dewar B. A diptube 6 connects the helium in the tank 7 with a line 3 which can transfer the helium to the magnet of the device enclosing the magnet C such as an MRI scanner. Line 5 connects the liquid helium container B and the control unit D and transmits data relating to the pressure of the helium gas in the top of the tank 7.

The control unit D can be a programmable logic control (PLC) device that will measure both the rate of flow of the helium gas in line 2 as well as its pressure in the neck or upper portion of the tank 7 holding the liquid helium. The control unit D will measure when the pressure in the tank 7 exceeds a certain, pre-determined value and send a signal to the helium gas cylinder A to stop the flow of the helium gas through line 2. In this manner, the filling of the cryostat in the magnet of the device C will be stopped before whistling occurs, and before quench and loss of helium occurs.

Figure 2:
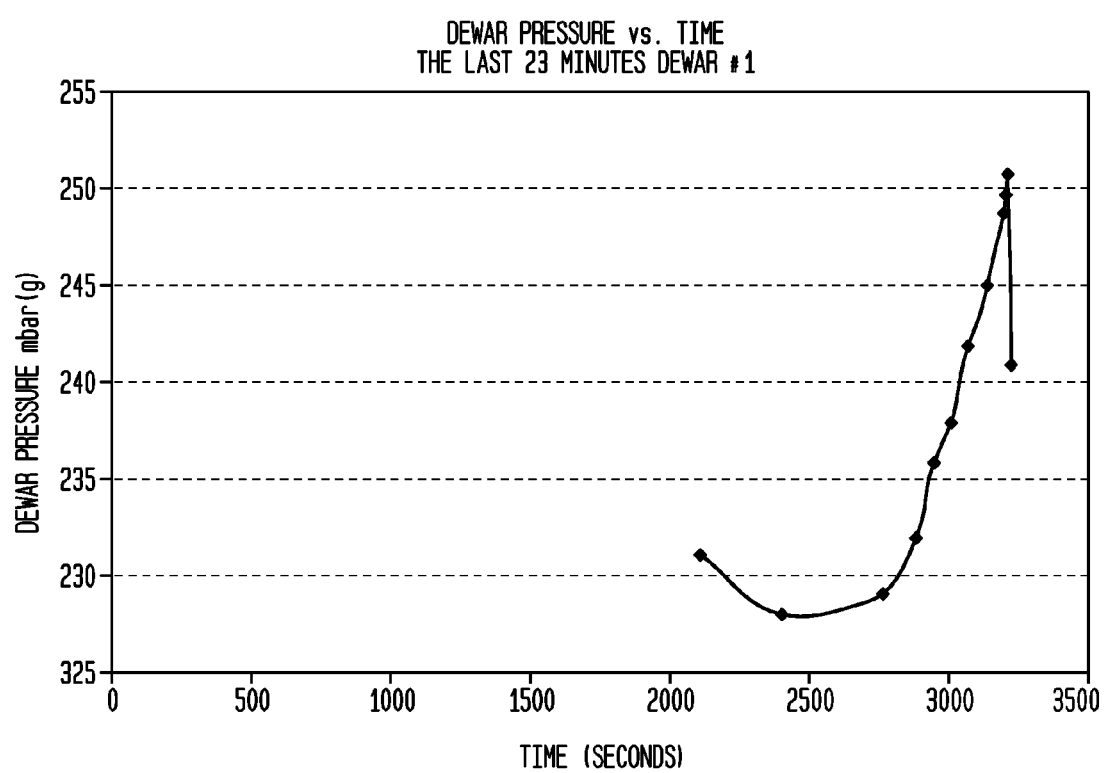
FIG. 2 is a graph showing dewar pressure versus time for the filling of a dewar with helium.

FIG. 2 represents a graph depicting the pressure of the dewar in mbar(g) versus time in seconds for liquid helium being fed to a dewar. The pressure of the dewar begins to rise at approximately 13 minutes before the dewar would whistle under the old technique of determining when to stop the fill of helium. This rise in pressure is due to the filling process itself rather than through operation of the pressure regulator. The pressure increase accelerates to a peak and then immediately drops. The filling operation must stop at the time the pressure of the gaseous helium in the dewar peaks and begins decreasing. Otherwise the helium could enter the cryostat and cause a quench with its deleterious consequences.

The pressure of the helium gas in the dewar can be measured by any conventional means and when the pressure peaks and begins its decline, a signal can be sent to the control unit stopping the filling operation. So for example, the operation according to FIG. 1, a signal would be sent through line 5 to the transfer monitoring and control unit D when a pressure transducer and indicator P1 marks the pressure of gaseous helium in the dewar peaking and beginning to drop. The flow of gaseous helium from the gas cylinder A would be stopped by the transfer monitoring and control unit D.

Figure 3:
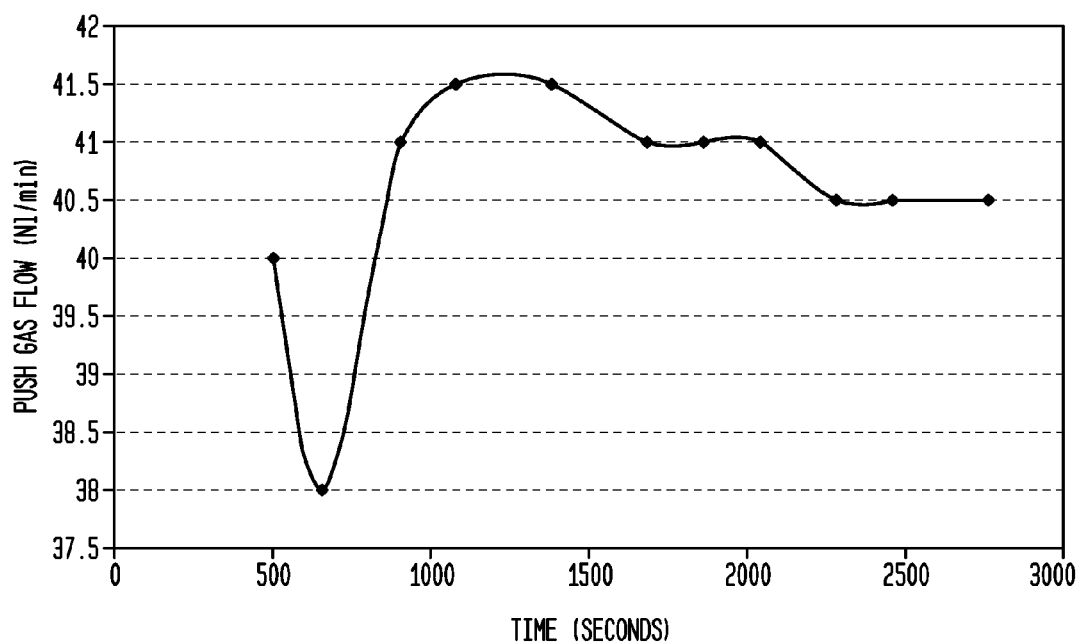
FIG. 3 is a graph of push gas flow of helium versus filling time for a dewar filling operation.

In FIG. 3, the graph shows the flow rate of push gas in normal liters (Nl) per minute versus time in seconds. As noted in this graph, once the dewar pressure is stabilized, then the push gas flow rate will almost be constant. The ratio of helium push gas flow into the dewar and the amount of liquid helium pushed out of the dewar (and into the cryostat of the magnet) is constant at about 6 to 7 to 1. This constant has proven independent of the main process variable such as the content of the magnet and the dewar; magnet type; and the pressure of the magnet and of the dewar.

In operation then, when the ratio of push gas flow to the amount of liquid helium strays from the ratio of 6 or 7 to 1, then the fill operation is not proceeding as efficiently as possible and this could be indicative of a slow or improper fill going on.

Accordingly, with reference to the language regarding FIG. 1, the transfer monitoring and control unit D will receive as data both the flowmeter F1 data through line 4 and the volume of liquid helium leaving dewar B through line 3 via P1 and line 5. The transfer monitoring and control unit D will calculate based on this data the ratio of the flow rate of the helium push gas to the amount of liquefied helium pushed out of the dewar. When this value strays from 6 or 7 to 1 then an alert is sent to the flowmeter and gaseous helium flow is stopped. The operator of the filling operation can then investigate if a slow fill condition exists or some other condition that would cause the ratio to stray from 6 or 7 to 1. This can stop a quenching situation from occurring with resulting losses of helium.

While this invention has been described with respect to particular embodiments thereof, it is apparent that numerous other forms and modifications of the invention will be obvious to those skilled in the art. The appended claims in this invention generally should be construed to cover all such obvious forms and modifications which are within the true spirit and scope of the invention.

Having thus described the invention, what we claim is:

1. A method for filling a magnet comprising feeding gaseous helium to a container of liquefied helium; feeding liquefied helium to said magnet; measuring a flow rate of said gaseous helium from said container and measuring a pressure of said gaseous helium in said container; and stopping flow of said liquefied helium when the measured pressure reaches a peak value and begins to drop.

2. The method as claimed in claim 1 wherein said container is a dewar.

3. The method as claimed in claim 2 wherein said gaseous helium is fed to the top of said dewar.

4. The method as claimed in claim 2 wherein said measured pressure is measured in said dewar.

5. The method as claimed in claim 1 wherein the flow of said liquefied helium is controlled by the flow of said gaseous helium.

6. The method as claimed in claim 1 wherein the flow of said liquefied helium is stopped by stopping the flow of gaseous helium.

7. The method as claimed in claim 1 wherein said magnet is a superconductive magnet.

8. The method as claimed in claim 1 wherein the flow of said liquefied helium is measured with a flowmeter.

9. The method as claimed in claim 1 wherein said peak pressure is measured via a control unit.

10. A method for stopping a filling process comprising feeding gaseous helium to a container of liquefied helium; feeding liquefied helium to a magnet; measuring a flow rate of said gaseous helium; measuring a pressure of said gaseous helium in the dewar; and stopping flow of said liquefied helium when said measured pressure reaches a peak value and begins to drop.

11. The method as claimed in claim 10 wherein said container is a dewar.

12. The method as claimed in claim 10 wherein said gaseous helium is fed to the top of said dewar.

13. The method as claimed in claim 10 wherein said measured pressure is measured in said dewar.

14. The method as claimed in claim 10 wherein the flow of said liquefied helium is controlled by the flow of said gaseous helium.

15. The method as claimed in claim 10 wherein the flow of said liquefied helium is stopped by stopping the flow of gaseous helium.

16. The method as claimed in claim 10 wherein said magnet is a superconductive magnet.

17. The method as claimed in claim 10 wherein the flow of said liquefied helium is measured with a flowmeter.

18. The method as claimed in claim 10 wherein said peak pressure is measured via a control unit.

19. A method for detecting a slow transfer of liquid helium from a dewar to a cryostat of a super conductive magnet comprising feeding gaseous helium to a container of liquefied helium; feeding liquefied helium to said magnet; measuring a flow rate of said gaseous helium from said container and measuring the amount of liquefied helium pushed out of said container; and stopping the flow of said gaseous helium when the ratio of the flow rate of the gaseous helium to the amount of liquefied helium pushed out of said container is different than 6 or 7 to 1.

20. The method as claimed in claim 19 wherein said container is a dewar.

21. The method as claimed in claim 20 wherein said gaseous helium is fed to the top of said dewar.

22. The method as claimed in claim 20 wherein said measured pressure is measured in said dewar.

23. The method as claimed in claim 19 wherein the flow of said liquefied helium is controlled by the flow of said gaseous helium.

24. The method as claimed in claim 19 wherein the flow of said liquefied helium is stopped by stopping the flow of gaseous helium.

25. The method as claimed in claim 19 wherein said magnet is a superconductive magnet.

26. The method as claimed in claim 19 wherein the flow of said liquefied helium is measured with a flowmeter.

27. The method as claimed in claim 19 wherein said different ratio is less than 6 or 7 to 1.

* * * * *